Figure 1:
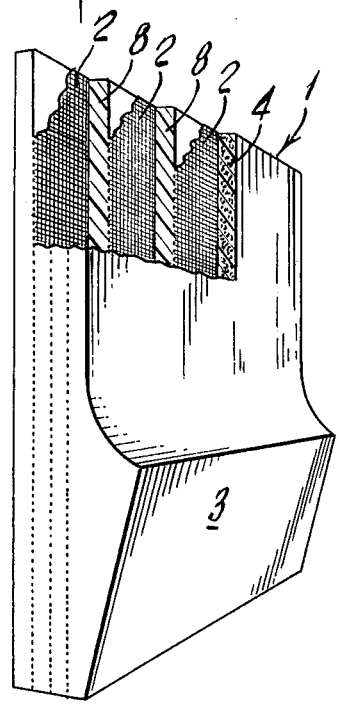

United States Patent [19]

Severinsen

[11] 4,037,009

[45] July 19, 1977

[54] CONDUCTIVE ELASTOMERIC ELEMENTS

[75] Inventor: John Severinsen, Middletown, N.J.

[73] Assignee: Metex Corporation, Edison, N.J.

[21] Appl. No.: 713,331

[22] Filed: Aug. 11, 1976

[51] Int. Cl.² .............................................. B32B 7/00
[52] U.S. Cl. ............................... 428/241; 174/35 GC;
174/35 MS; 428/242; 428/253; 428/254;
428/283; 428/325; 428/425
[58] Field of Search ............... 428/197, 206, 208, 209,
428/241, 242, 244, 247, 253, 254, 256, 283, 285,
290, 323, 325, 447, 450, 425; 174/35 MS, 35 GC

[56] References Cited

U.S. PATENT DOCUMENTS

| | | | |
|---|---|---|---|
| 2,727,084 | 12/1955 | Schreiber | 174/35 GC |
| 2,882,082 | 4/1959 | Poltorak et al. | 428/256 |
| 3,140,342 | 7/1964 | Ehrreich et al. | 174/35 GC |
| 3,253,618 | 5/1966 | Cook | 174/DIG. 8 |
| 3,487,186 | 12/1969 | Johnson et al. | 174/35 MS |
| 3,745,466 | 7/1973 | Pisano | 174/35 MS |

*Primary Examiner*—James J. Bell
*Attorney, Agent, or Firm*—Bierman & Bierman

[57] ABSTRACT

An electromagnetic shielding element comprising a moldable elastomer containing a particulate conductive filler and at least one layer of knitted wire mesh in said elastomer. The filler is preferably a precious metal, especially silver, and its preferred form is as a coating on copper or glass. The element may be composed of a plurality of layers of knitted mesh embedded in the elastomer and the directions of extension of the loops in the layers are at angles to one another. The element is useful as a combination gasket and electromagnetic shield.

20 Claims, 2 Drawing Figures

U.S. Patent July 19, 1977 4,037,009

CONDUCTIVE ELASTOMERIC ELEMENTS

The present invention is directed to an improved form of electromagnetic shielding elements; more particularly, and element which overcomes many of the disadvantages of the prior art.

Previously known elements of this character comprise a mixture of an elastomer (which is nonconductive) and a conductive filler material embedded therein. The filler material is often of precious metal, either in pure form, or as a coating on a base material. The base material is frequently copper or glass and the precious metal is often silver. P In order to insue good conductivity, it is necessary that the conductive metal surfaces of the filler be in contact with one another. It is, therefore, necessary to use substantial quantities of filler and use high compressive forces (up to 200 pounds per square inch) to be certain that the conductive paths are good in all directions. This enables the electromagnetic energy to flow in an uninterrupted manner.

This produces an elastomer of very low tensile strength. Therefore, once it has been stretched from its normal dormant sectional volume, its conductivity will be seriously impaired because at least some of the conductive particles have been moved out of contact with one another. Furthermore, it is not possible to bend such elastomers around a small radius or to roll them back upon themselves to provide an additional layer of material. Should one attempt to do this, the tensile forces which are set up at the sharp bend or fold will cause at least a partial breakdown of the conductive path and/or a rupture of the elastomer itself.

In accordance with the present invention, these disadvantages in prior art shielding elements are overcome by incorporating into the filled elastomer at least one layer of knitted wire mesh. It has been found that such a shielding element will exhibit no measurable decrease in conductivity, even when exposed to substantial tensile strains. It is believed that this is due to the peculiar nature of knitted wire mesh. The interlocking loops of such mesh are capable of sliding within one another when the shielding element is stretched Thus, the wire itself is not stretched or elongated, and the mesh will return to its unstressed (or dormant) condition when the tension is removed.

This permits the construction of shielding elements which are rolled up upon themselves in a plurality of layers. In addition, there is no problem in sharply bending such elements, even around edges of openings and the like.

Since the elastomer can adhere to the exposed surface of each wire within the knitted construction, the integrity of the electrical path is maintained.

It should be noted that it is not feasible to substitute a woven wire screen for the mesh of the present invention. The screen cannot flex since the adjacent wires hold it firmly in place within the established grid of the system. Therefore, any attempt at sharp bending of stretching produces a permanent "set" to the element. This spreads the particles of filler apart and reduces the contact between the particles. This, in turn, causes an undesirable degradation of the conductivity of the element.

While the wire mesh of the present invention can be fabricated from any conductive material, it has been found most preferable to use either Monel metal or Ferrex. The latter is a trademark of Metex Corporation for a copper-clad steel wire which has been tin plated. The wire materials should be sufficiently flexible so that they can be knitted and should be of such character that no undesirable reactions will take place with the filler material, the elastomer, and any environment to which the material may be exposed in use. All of these considerations are well known to the person of ordinary skill in the art.

The filler material may be any particulate conductive substance. Precious metals are preferred because of their good conductivity and their resistance to many reactions. Such metals may be coated on a wide variety of substrates, both conductive and non-conductive. Copper has been found to be advantageous as the substrate and glass spheres are particularly suitable.

It is to be understood that, in the specification and claims hereof, the terms "spheres" is intended to include spheroids, cubes, rectangular solids, irregular solids, etc.

Any elastomer which is capable of being formed into a solid shape and does not react undesirably with the material with which it is in contact is suitable in the present invention. Silicone polyurethane has been found particularly suitable.

The wire diameter is preferably from 0.001 to 0.008 inches and it is also preferable to have from 10 to 30 openings per inch of knitted mesh. It has been found advantageous to form each wire loop of a plurality of strands rather than merely one strand alone. It is most preferable to have from one to six strands in each wire loop. It is similarly preferable to have from one to four layers of mesh in each element.

The tensile strength of the element is equal to the total area of exposed wires within the cross sections times the tensile strength of the wire being used. Thus, a wide range of shielding characteristics can be achieved by suitable selection of the various parameters discussed herein. It has been found that these characteristics will be maintained under extremely severe tensile forces in all directions.

Figure 2:
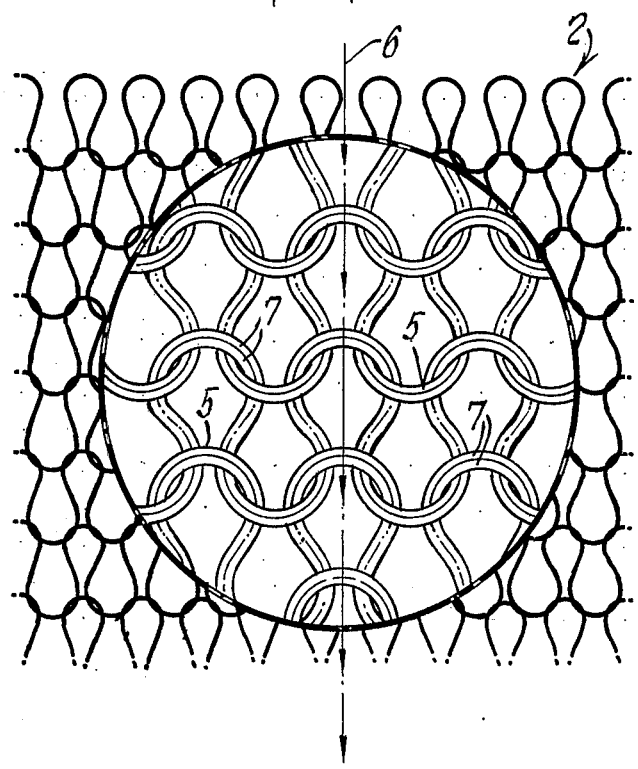

In the accompanying drawings constituting a part hereof, and in which like reference characters indicate like parts, FIG. 1 is a perspective cutaway view of a shielding element according to the present invention; and FIG. 2 is an enlarged view of the knitted mesh used in the element of FIG. 1.

Element 1 is composed of three layers of knitted wire mesh 2 embedded in elastomer 3. Elastomer 3 also contains silver-coated glass spheres 4 distributed therethrough. Between the layers of mesh 2 are elastomer layers 8.

In FIG. 2, mesh 2 is composed of a series of interlocking loops 5, each composed of strands 7. The direction of the loops is shown by line 6.

The manufacture of elements in accordance with the present invention generally follows known prior art techniques. The elastomer (for example, silicone polyurethane) is blended to the desired consistency and the conductive filler (for example, silver-coated glass spheres) is mixed therein. This composition is processed through steel rollers to form a sheet of suitable thickness (0.125 inches has been found suitable). A layer of the foregoing composition is placed on the bottom surface of a mold and one or more pieces of knitted wire mesh are then placed thereon. When several layers are used, it has been found particularly desirable, but not essential, that the several layers of knitted mesh have their directions of loop extension at an angle to one another. This angle can be between 0° and 180°. A final layer of filled elastomer composition is placed on top of the uppermost exposed layer of knitted mesh. The entire "sandwich" is then heated and pressed in known manner in order to cause the elastomer to flow into all of the interstices in the various layers of knitted mesh. The final product may require post cure treatment in the manner known in the art.

In the event that comparatively dense knitted mesh is used (of the order of 25 holes per inch), it may be necessary to provide a thin layer of elastomer compound between some of the layers of knitted mesh used. For example, the addition of one layer of composition for each two layers of mesh will aid in filling all of the voids between the wires. This is because the flow will then come from two sides of the cross section during the heating and pressing operation.

While only a limited number of embodiments of the present invention have been specifically disclosed, it is, nonetheless, to be broadly construed and not to be limited except by the character of the claims appended hereto.

What we claim is:

1. An electromagnetic shielding element comprising an elastomer containing a particulate conductive filler and at least one layer of knitted wire mesh in said elastomer.

2. An element according to claim 1 wherein said elastomer is silicone polyurethane.

3. An element according to claim 1 wherein said filler is precious metal.

4. An element according to claim 3 wherein said precious metal is coated on a substrate.

5. An element according to claim 4 wherein said substrate is of base metal.

6. An element according to claim 5 wherein said substrate is copper.

7. An element according to claim 4 wherein said substrate is non-conductive.

8. An element according to claim 7 wherein said substrate is glass.

9. An element according to claim 3 wherein said filler is silver plated glass spheres.

10. An element according to claim 1 wherein there is provided a plurality of layers of said mesh.

11. An element according to claim 10 wherein each of said layers has loops extending in one direction in the plane of said mesh, at least one of said layers having said direction at an angle to said direction of at least one other of said layers.

12. An element according to claim 11 wherein adjacent layers of said mesh have their directions at an angle to one another.

13. An element according to claim 10 wherein at least two of said layers are separated by further layers of said elastomer.

14. An element according to claim 1 wherein said mesh is of copper clad steel wire which has been tin plated.

15. An element according to claim 1 wherein each of the loops of said knitted mesh are formed of from 1 to 6 strands of said wire.

16. An element according to claim 1 wherein said wire has a diameter of 0.001 to 0.008 inches.

17. An element according to claim 1 wherein said knitted mesh has from 10 to 30 openings per inch.

18. An element according to claim 10 wherein there are 1 to 4 of said layers.

19. An element according to claim 11 wherein said angle is between 0° and 180°.

20. An element according to claim 1 wherein said mesh is of a nickel-copper corrosion resistant alloy.

* * * * *